United States Patent [19]

Schweigert et al.

[11] Patent Number: 5,192,917
[45] Date of Patent: Mar. 9, 1993

[54] CIRCUIT AND METHOD FOR DETECTING AN AMPLITUDE AND OFFSET DEVIATION OF TWO SINUSOIDAL SIGNALS

[75] Inventors: Ralf Schweigert, Adelsdorf; Albrecht Donat, Dachsbach, both of Fed. Rep. of Germany

[73] Assignee: Siemens Aktiengesellschaft, Berlin & Munich, Fed. Rep. of Germany

[21] Appl. No.: 801,938

[22] Filed: Dec. 3, 1991

[30] Foreign Application Priority Data

Dec. 3, 1990 [EP] European Pat. Off. ............ 90123125

[51] Int. Cl.$^5$ .......................... H03B 1/00; H03K 5/00; H03K 5/08
[52] U.S. Cl. .................................... 328/162; 328/168; 328/171; 328/175; 328/164
[58] Field of Search ............... 328/162, 163, 165, 168, 328/171, 173, 175; 307/491

[56] References Cited

U.S. PATENT DOCUMENTS 3,464,022  8/1969  Locheed et al. .................... 330/144
3,705,980  12/1972  Brickner et al. .................... 235/186
3,764,923  10/1973  Woodworth et al. ............... 328/175
4,267,470  5/1981  Kawakami et al. ................. 307/515

FOREIGN PATENT DOCUMENTS 2161657  6/1973  Fed. Rep. of Germany .
2907865  9/1979  Fed. Rep. of Germany .
3843108  2/1990  Fed. Rep. of Germany .

Primary Examiner—Timothy P. Callahan
Attorney, Agent, or Firm—Kenyon & Kenyon

[57] ABSTRACT

To detect amplitude deviations and/or offset deviations in two sinusoidal signals (S1, S2), electrically staggered from each other by 90°, both signals (S1, S2) are evaluated by way of threshold stages (K11, K12, K21, K22). The zero passages of the one signal (S1, S2) each indicate trigger time points ($1_{up}$, $1_{down}$, $2_{up}$, $2_{down}$) for the amplitude of the other signal (S2, S1) in each instance. The output signals (X1, X2, A, $\overline{A}$, B, $\overline{B}$) of the threshold stages (K11, K12, K21, K22) are analyzed in the a regulating mechanism. Regulation can take place in accordance with the errors detected.

9 Claims, 3 Drawing Sheets

CIRCUIT AND METHOD FOR DETECTING AN AMPLITUDE AND OFFSET DEVIATION OF TWO SINUSOIDAL SIGNALS

BACKGROUND OF THE INVENTION

The present invention relates to a method for detecting an amplitude deviation with predetermined reference amplitudes and/or an offset deviation from a desired offset value of two similar, sinusoidal signals S1 and S2, differing in phase by approximately 90°.

A method for detecting such information is disclosed in DE-OS 38 43 108. The approach used to implement this method is proven, but a problem arises because this implementation requires quite a significant effort.

The present invention seeks to solve this implementation problem by providing a detection method where amplitude deviations and offset deviations can be detected with a few, simple, process steps. The present invention seeks to provide a circuit implementing the method of the present invention in the simplest possible manner.

SUMMARY OF THE INVENTION

The present invention provides: a first threshold stage supplying a first characteristic signal as condition A when a signal S1 exceeds a predetermined reference amplitude; a second threshold stage supplying a second characteristic signal as condition B when a signal S2 exceeds a predetermined reference amplitude; a third threshold stage able to detect zero passages of the signal S1 both in an upward and a downward direction, at times $1_{up}$ and $1_{down}$, respectively; a fourth threshold stage able to detect zero passage of the signal S2 both in an upward and a downward direction, at times $2_{up}$ and $2_{down}$, respectively; and a regulating mechanism that carries out a logical linking as follows:

a) an output signal "amplitude of S1 is greater than the reference amplitude" is generated if condition A occurs at two consecutive times $2_{up}$ and $2_{down}$;

b) an output signal "amplitude of S1 is less than the reference amplitude" is generated if condition A fails to occur at two consecutive times $2_{up}$ and $2_{down}$;

c) an output signal "offset of S1 is too great" is generated if condition A occurs at time $2_{up}$ and condition A fails to occur (i.e., $\overline{A}$ occurs) at time $2_{down}$, with these times being consecutive;

d) an output signal "offset of S1 is too small" is generated if condition A fails to occur (i.e., $\overline{A}$ occurs) at time $2_{up}$ and condition A occurs at time $2_{down}$, with these times being consecutive;

e) an output signal "amplitude of S2 is greater than the reference amplitude" is generated if condition B occurs at two consecutive times $1_{up}$ and $1_{down}$;

f) an output signal "amplitude of S2 is less than the reference amplitude" is generated if condition B fails to occur (i.e., $\overline{B}$ occurs) at two consecutive times $1_{up}$ and $1_{down}$;

g) an output signal "offset of S2 is too great" is generated if condition B occurs at time $1_{up}$ and condition B fails to occur (i.e., $\overline{B}$ occurs) at time $1_{down}$, with these times being consecutive; and h) an output signal "offset of S2 is too small" is generated if condition B fails to occur (i.e., $\overline{B}$ occurs) at time $1_{up}$ and condition B occurs at time $1_{down}$, with these times being consecutive.

An advantageous circuit for implementing the method of the present invention triggers a logic "1" signal at each occurrence of a positive half-wave of the signal S1 or the signal S2 in the third or fourth threshold stage, respectively, existing for the duration of this half-wave. The rising edge of the logic "1" signal indicates the time point $1_{up}$ or $2_{up}$, respectively, and the falling edge of the logic "1" signal indicates the time point $1_{down}$ or $2_{down}$, respectively. Thus, a single binary signal, easily generated in the form of a block, can be used to generate every desired time point, in a simple manner.

Both the upper and the lower maximum value of the amplitude can be detected by a single threshold stage since the first and second threshold stage each have a rectifier stage on the input side.

The easy detectability of the amplitude deviation and/or offset deviation also permits the use of the deviation signal as a regulator, regulating the signal S1 or S2, respectively, to the reference amplitude, or to the offset-free reference. This enables the present invention not only to detect errors, but also to compensate them.

An advantageous circuit in such a regulating process counts, in a corresponding counter, back by a defined value when the output signals have an unacceptably high amplitude or offset. Similarly, the circuit counts, in a corresponding counter, up by a defined value when the output signals have an unacceptably low amplitude or offset. The output signals of the counters are provided as retro-regulating setting values. This guarantees a continuous regulating process because each counter's status is constantly pendulum-adjusted with each comparison process.

Since offset errors are eliminated by forming the difference of the output signal of the related counter with the signal containing the error in each case, and since amplitude errors are eliminated by multiplication of the output signal of the related counter with the signal to be corrected in each case, signal feed-back is technologically simple. It is possible in both cases to work with the digital output signal of the related counters, however, it has proven advantageous in practice to carry out offset error correction with an analog signal formed by a digital to analog conversion of the counter output signal. The type of digital to analog conversion used is a matter of design choice. It is possible, for example, to first convert the digital signal into a signal with modulated pulse width with the mean value of this signal being available as an analog signal for further processing. The pulse width modulation can also take place, for example, by comparing the counter status of the counter in question with a signal having a saw-tooth shape.

DETAILED DESCRIPTION

Figure 1:
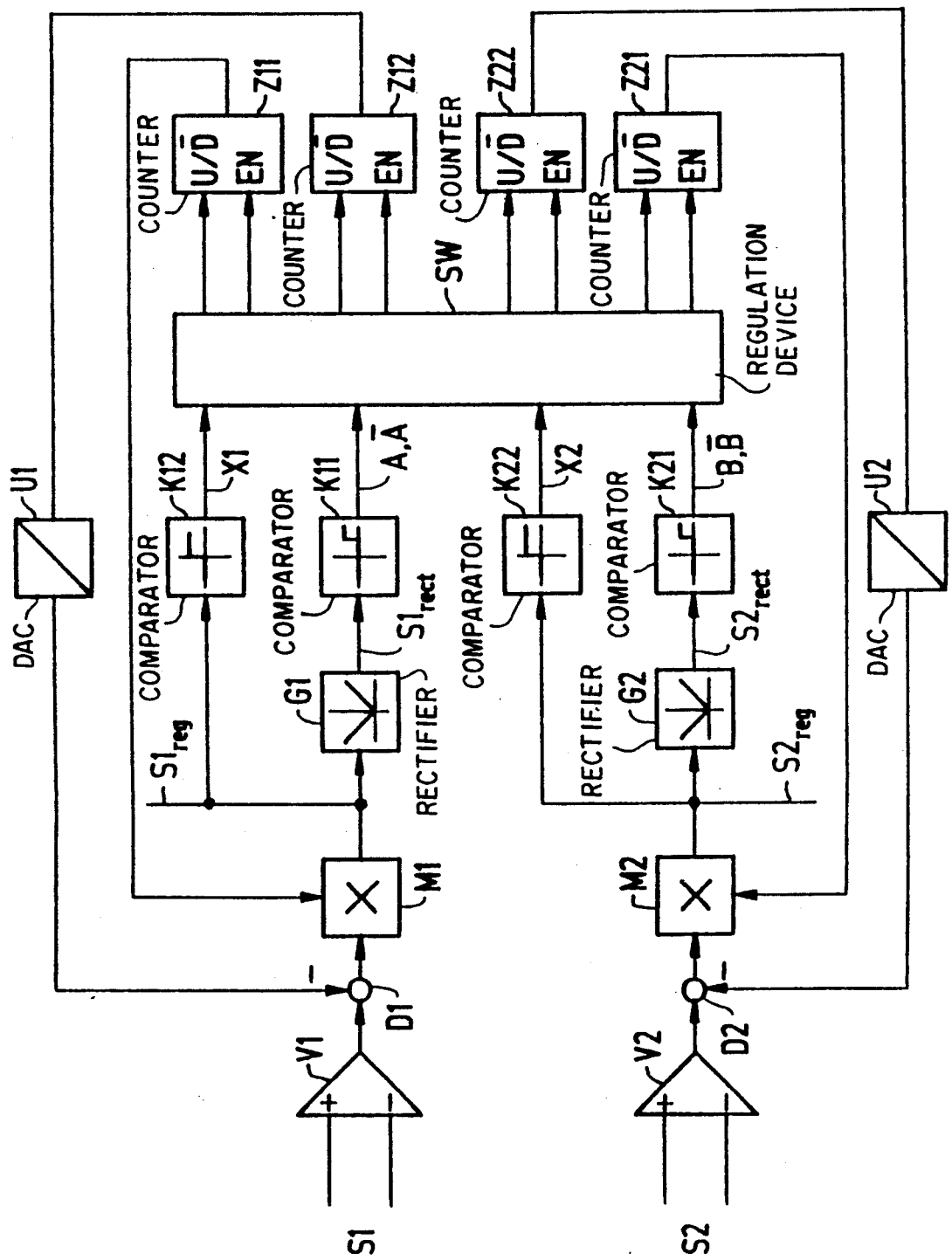
FIG. 1 illustrates a block schematic of the present invention.

In the representation according to FIG. 1, a sinusoidal signal S1 is an input of an amplifier V1, for example as a difference signal, and another sinusoidal signal S2 is an input of an amplifier V2 in the same manner. In an ideal case, the signals S1 and S2 have the same predetermined reference amplitude, have a 90° phase difference and are offset-free. However, this ideal case rarely exists and thus a slight amplitude and/or offset error must always be expected.

It is the object of the circuit according to FIG. 1 to eliminate both amplitude error and offset error. For this purpose, the output signal of the amplifier V1 is passed, via a difference element D1 and a multiplier M1, to further processing devices, not shown for the sake of clarity, as a correspondingly regulated signal $S1_{reg}$. In a corresponding manner, the output signal of the amplifier V2 is passed via a difference element D2 and a multiplier M2 as a regulated signal $S2_{reg}$, to further processing devices, not shown.

The following description varies from the description above in that the signal S1 and the signal S2 are not varied by a correction factor, (i.e., signals S1 and S2 are not acted upon by either the difference element D1 or D2, or the multiplier M1 or M2.) The signal S1 is thus passed to a comparator K12 in unchanged form. This comparator outputs a binary signal logic "1" when there is a positive half-wave of the signal S1, and otherwise outputs a binary signal logic "0". This output signal, (i.e., either "1" or "0") is designated as X1 in the following description.

The rectifier G1 rectifies the signal S1, such that a rectified signal $S1_{rect}$ is present at the output of the rectifier G1. This signal $S1_{rect}$ is input to a comparator K11. The comparator K11 outputs a signal logic "1", signal A, at its output when the signal input to it exceeds the predetermined reference amplitude of the signal S1. Otherwise it outputs a signal logic "0", signal $\overline{A}$. The output signals of the comparators K12 and K11 are inputs for a regulating mechanism SW. The regulating mechanism SW also receives input signals X2 obtained directly from the signal S2 via comparator K22 and B, $\overline{B}$ obtained indirectly from its rectified signal $S2_{rect}$, via a rectifier G2 and comparator K21. Therefore these input signals basically correspond to the signals X1 and A, $\overline{A}$.

The regulating mechanism SW, determines whether the signal S1 or S2 has a lesser or greater amplitude than the related amplitude reference value, and whether offset value of the signals S1 or S2 is greater than or less than a predetermined offset value. This determination is made on the basis of logical linking of the input signals. If, during a detection process, a determination is made that the amplitude of the signal S1 is too great, the count of a counter Z12 is decremented by a value "1"; if the amplitude of the signal S1 is too small, the count of the counter Z12 is incremented by a value "1". A counter Z22 is similarly controlled for the signal S2. Similarly, if the offset of the signal S1 is too great, a count of a counter Z11 is decremented by a value "1"; if the offset is too small, the count of the counter Z11 is incremented by a value "1". A counter Z21 is similarly controlled for the signal S2. The counting inputs are designated by the mnemonic U/$\overline{D}$. In addition, an input EN is provided for each of the counters. This input EN is an enable signal provided by the regulating mechanism SW to enable the proper counter Z11, Z12, Z21 or Z22.

A digital counting value of the output signal of the counter Z12 indicates the amount of correction required for the offset of signal S1. To trigger the correction process, the output signal of the counter Z12 is passed to a digital to analog converter (DAC) U1. The analog signal produced by the DAC U1 is passed for feed-back regulation to the difference element D1, in a closed regulation loop.

The output signal of the counter Z11 indicates the deviation and accordingly, this digital signal can be used to correct the signal S1 via multiplier M1.

Feed-back regulation for the channel of the signal S2 from the counter Z21 to the multiplier M2 and from the counter Z22 via a DAC U2 to the difference element D2 is similarly accomplished.

Figure 2A:
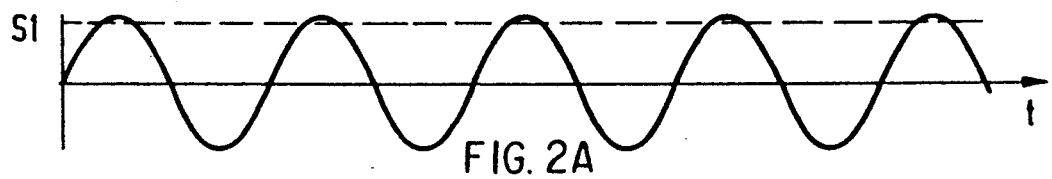
FIGS. 2A through 2H and 3A through 3H show significant signal progressions of the present invention.
Figure 2B:
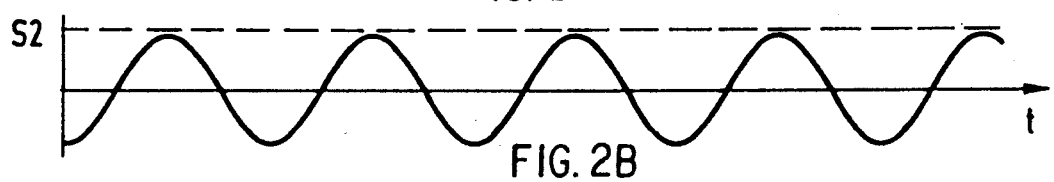
Figure 2C:
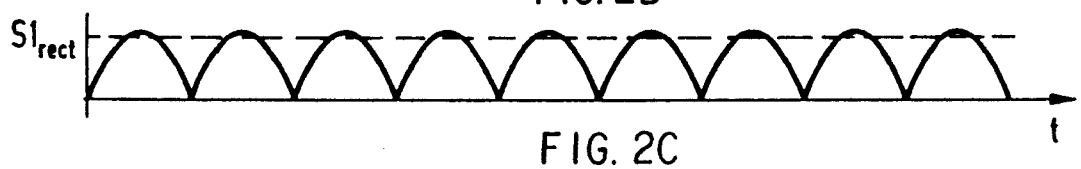
Figure 2D:
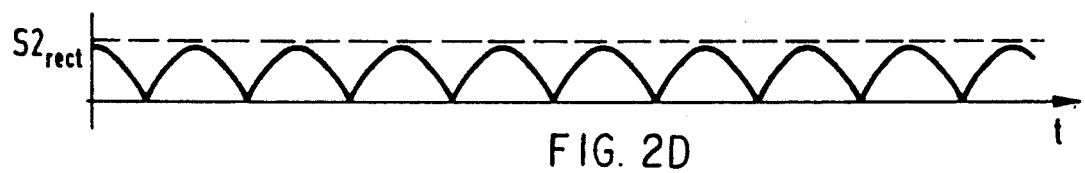

As example of some significant progressions of the present invention according to FIG. 1 are illustrated in FIGS. 2A through 2H. As shown in FIG. 2A, it is assumed that the signal S1 is greater than the predetermined reference amplitude (i.e. there is an amplitude error). The predetermined reference amplitude is indicated with broken lines in each case in the time-synchronous representations. In addition, as shown in FIG. 2B, the signal S2 is less than the specific reference amplitude. In FIG. 2A, the signal S1 is shown as a raw signal in its progression. The signal S2 is shown in corresponding manner in FIG. 2B. FIGS. 2C and 2D represent the rectified signal S1 (i.e. the signal $S1_{rect}$) and the rectified signal S2 (i.e. the signal $S2_{rect}$) respectively. Furthermore, the signals previously discussed in FIG. 1, i.e. X1 and X2, as well as the signals A, $\overline{A}$ and B, $\overline{B}$, are shown in their time progression in FIGS. 2E, 2F, 2G and 2H respectively. With the time coincidence of the individual signal progressions present, the signal X1 has a value of logic "1" with every positive half-wave of the signal S1, and that the signal X2 has a value of logic "1" with every positive half-wave of the signal S2.

The inventors of the present invention have recognized that each zero passage of the signal S2 represents a time point at which determining whether or not the signal S1 is above the reference value at its peak is easy. Similarly, the zero passages of the signal S1 always establish time points at which determining whether the signal S2 is above or below the reference amplitude is simple. Even when slightly time staggering the zero passages, clear evaluation criteria are still possible due to the flat signal progression at the peak of the signals S1 and S2.

Figure 2E:
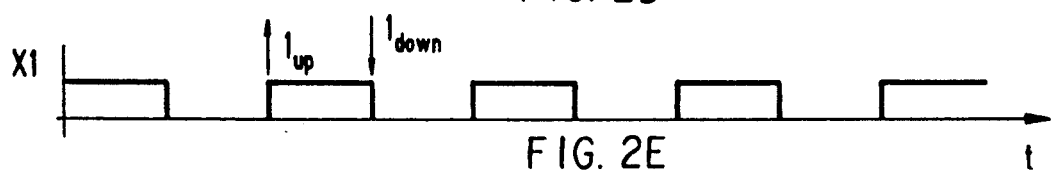
Figure 2F:
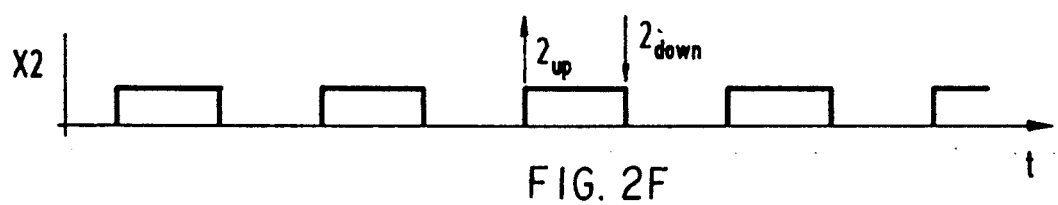

It is evident from the above explanation that the rising and falling edges of the signals X1 and X2 determine trigger time points for the system in each case. As shown in FIG. 2E, in the signal X1 the time point of a positive zero passage of the signal S1 is indicated by arrow $1_{up}$, and that of a negative signal passage of the signal S1 is indicated by arrow $1_{down}$, for any two blocks of the signals in question. As shown in FIG. 2F, the same applies for the signal X2, in which the corresponding positive and negative zero passages of the signal S2 are indicated by arrows $2_{up}$ and $2_{down}$ respectively in the blocks of the signal X2.

Figure 2G:
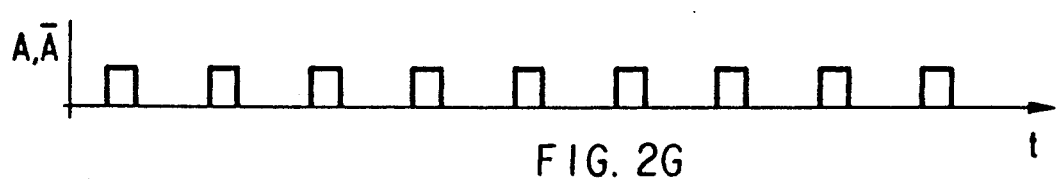
Figure 2H:
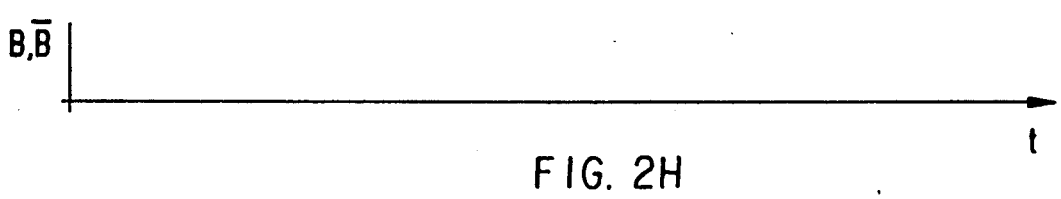
Figure 3A:
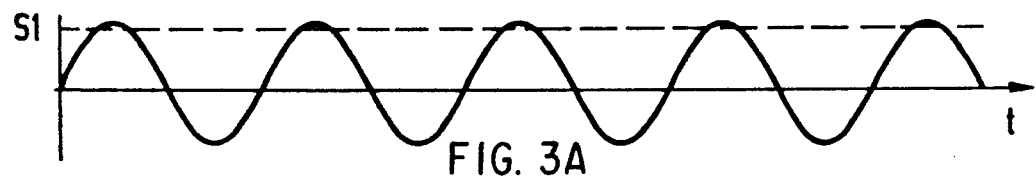
Figure 3B:
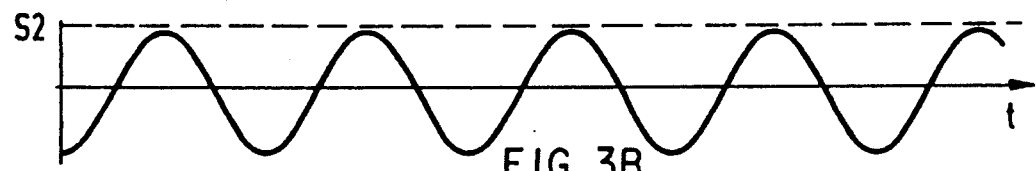
Figure 3C:
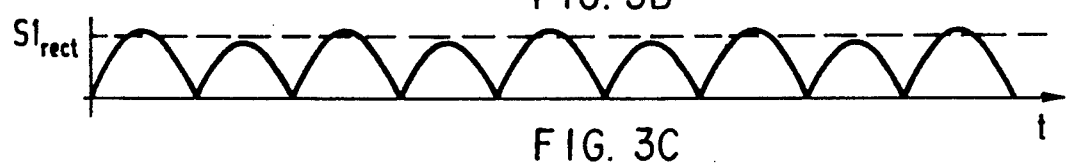
Figure 3D:
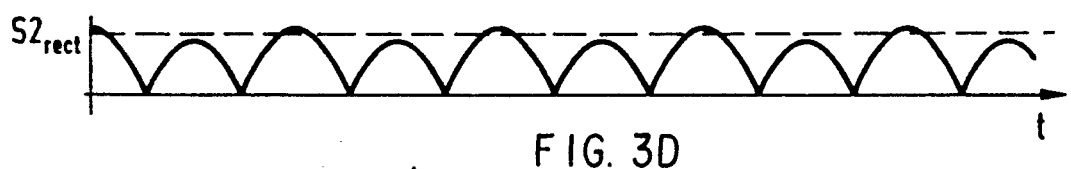
Figure 3E:
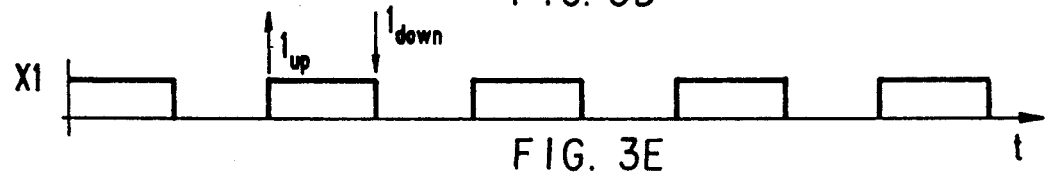
Figure 3F:
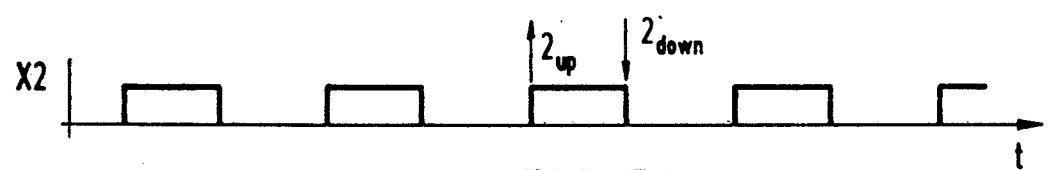
Figure 3G:
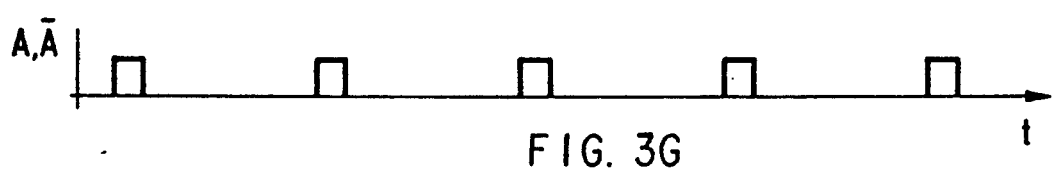
Figure 3H:
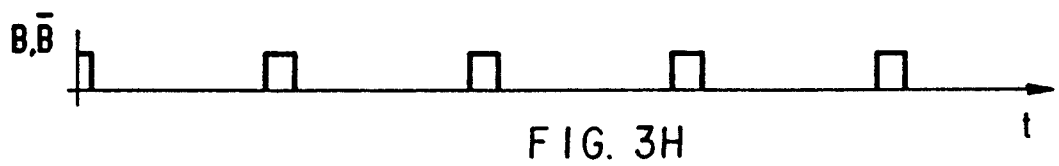

FIGS. 2G and 2H show the progression of the output signal of the comparator K11 and the comparator K21 of FIG. 1. It is evident from FIG. 2G that any time the signal S1 exceeds the reference amplitude, a signal logic "1", A, is present. Otherwise a signal logic "0", $\overline{A}$, is present. Since the signal S2 never exceeds the reference amplitude in this example a signal logic "0", $\overline{B}$ is always present.

The regulating mechanism SW contains the following logic linking. An output signal "amplitude of S1 is greater than the reference amplitude" is generated if signal A (signal logic "1") occurs at two consecutive trigger times $2_{up}$ and $2_{down}$. An output signal "amplitude of S1 is less than the reference amplitude" is generated if signal A (signal logic "1") fails to occur (i.e. the condition $\overline{A}$ is met) at two consecutive trigger times $2_{up}$ and $2_{down}$.

For the channel carrying the signal S2, the same applies; i.e., an output signal "amplitude of S2 is greater than the reference amplitude" is generated if signal B (signal logic "1") occurs at two consecutive trigger times $1_{up}$ and $1_{down}$, and an output signal "amplitude of S2 is less than the reference amplitude" is generated if signal B (signal logic "1") fails to occur (i.e., the condition $\overline{B}$ is met) at two consecutive trigger times $1_{up}$ and $1_{down}$. At the occurrence of any of these conditions the corresponding counter Z12 or Z21 is activated and its count is incremented or decremented by "1" as described above.

FIGS. 3A-3H illustrate the signals of the present invention when the signal S1 has an overly high offset value.

The logic linking in the regulating mechanism SW, of the signals shown, is such that the following conditions are met. An output signal "offset of S1 is too great" is generated if signal A (signal logic "1") occurs at trigger time $2_{up}$ and signal A (signal logic "1") fails to occur (i.e., the condition $\overline{A}$ is met) at trigger time $2_{down}$, with these trigger times being consecutive. This example is illustrated in FIGS. 3A-3H, as explained above. An output signal "offset of S1 is too small" is generated if signal A (signal logic "1") fails to occur (i.e., condition $\overline{A}$ is met) at trigger time $2_{up}$ and signal A (signal logic "1") occurs at trigger time $2_{down}$, with these trigger times being consecutive. Similarly, for the signal S2, an output signal "offset of S2 is too great" is generated if signal B (signal logic "1") occurs at trigger time $1_{up}$ and signal B (signal logic "1") fails to occurs (i.e., condition $\overline{B}$ is met) at trigger time $1_{down}$, with these trigger times being consecutive, and an output signal "offset of S2 is too small" is generated if signal B (signal logic "1") fails to occur (i.e., condition $\overline{B}$ is met) at trigger time $1_{up}$ and signal B (signal logic "1") occurs at trigger time $1_{down}$, with these trigger times being consecutive.

What is claimed is:

1. A circuit for detecting an amplitude deviation and/or offset deviation of two similar sinusoidal signals S1 and S2, out of phase by approximately 90°, with a predetermined reference amplitude, comprising:

a first threshold stage, said first threshold stage accepting a signal based on S1 and supplying a first characteristic signal as condition A, when the signal S1 exceeds said predetermined reference amplitude;

a second threshold stage, said second threshold stage accepting a signal based of S2 and supplying a second characteristic signal as condition B, when said signal S2 exceeds the predetermined reference amplitude;

a third threshold stage, said third threshold stage accepting said signal based of S1, detecting zero passages of said signal based on S1 both in an upward and a downward direction, and supplying trigger times $1_{up}$ and $1_{down}$, respectively based on the detected zero passages;

a fourth threshold stage, said forth threshold stage accepting said signal based of S2, detecting zero passages of the signal S2 both in an upward and a downward direction, and supplying trigger times $2_{up}$ and $2_{down}$, respectively based on the detected zero passages; and a regulating device, said regulating device accepting said first characteristic signal, said second characteristic signal, said trigger times $1_{up}$, $1_{down}$, $2_{up}$, and $2_{down}$ (SW)

producing an output signal indicating that an amplitude of S1 is greater than the reference amplitude when condition A is met at two consecutive trigger times $2_{up}$ and $2_{down}$;

producing an output signal indicating that an amplitude of S1 is less than the reference amplitude when condition A is not met at two consecutive trigger times $2_{up}$ and $2_{down}$, producing an output signal indicating that an offset of S1 is too great when condition A is met at trigger time $2_{up}$ and condition A is not met at trigger time $2_{down}$, wherein trigger times $2_{up}$ and $2_{down}$ are consecutive, producing an output signal indicating that an offset of S1 is too small when condition A is not met at trigger time $2_{up}$ and condition A is met at trigger time $2_{down}$, wherein trigger times $2_{up}$ and $2_{down}$ are consecutive, producing an output signal indicating that an amplitude of S2 is greater than the reference amplitude when condition B is met at two consecutive trigger times $1_{up}$ and $1_{down}$, producing an output signal indicating that an amplitude of S2 is less than the reference amplitude when condition B is not met at two trigger consecutive times $1_{up}$ and $1_{down}$, producing an output signal indicating that an offset of S2 is too great when condition B is met at trigger time $1_{up}$ and condition B is not met at trigger time $1_{down}$, wherein trigger times $1_{up}$ and $1_{down}$ are consecutive, and producing an output signal indicating that an offset of S2 is too small when condition B is not met at trigger time $2_{up}$ and condition B is met at trigger time $1_{down}$, wherein trigger times $1_{up}$ and $1_{down}$ are consecutive.

2. The circuit according to claim 1, wherein each occurrence of a positive half-wave of the signal S1 or the signal S2 in the third or fourth threshold stage, respectively, triggers a logic "1" signal existing for the duration of the half-wave, wherein the rising edge of the logic "1" signal indicates the trigger time point $1_{up}$ and $2_{up}$, respectively, and the falling edge of the logic "1" signal indicates the trigger time point $1_{down}$ or $2_{down}$, respectively.

3. The circuit according to claim 1, wherein said first threshold stage includes a rectifier stage said rectifier stage including an input and an output, said input accepting said signal based on S1 and said output providing a signal to the remainder of said first threshold stage.

4. The circuit according to claim 3, further comprising:

a first counter, a second counter, a third counter and a fourth counter, said first and second counters being associated with an amplitude status and an offset status, respectively, of said signal S1 and said third and fourth counters being associated with an amplitude status and an offset status, respectively, of said signal S2 wherein when output signals produced by said regulating device indicate an unacceptably high amplitude or offset, a corresponding counter is decremented by a defined value in each case, when output signals produced by said regulating device indicate an unacceptably low amplitude or offset, a corresponding counter is incremented by a defined value in each case, and each of said counters provide output signals as retro-regulating setting values.

5. The circuit according to claim 4, wherein offset errors are eliminated by forming a difference of the output signal of a related counter with the associated signal, S1 or S2, containing the error.

6. The circuit according to claim 5, further comprising:
a digital to analog converter converting the output signal of the related counter into a correcting analog signal.

7. The circuit according to claim 4, wherein amplitude errors are eliminated by multiplication of the output signal of the related counter with the signal S1 or S2 to be corrected.

8. A method for detecting and correcting an amplitude deviation of each of two signals S1 and S2 from reference value amplitudes and for detecting and correcting an offset deviation between S1 and S2 from a desired offset including steps of:
rectifying each of signals S1 and S2 to obtain $S1_{rect}$ and $S2_{rect}$, respectively comparing $S1_{rect}$ and $S2_{rect}$ with the reference value amplitudes to obtain signals CI1 and CI2, respectively, wherein:

signal CI1 is assumes a value A when $S1_{rect}$ is greater than a first reference value amplitude and assumes a value $\overline{A}$ when $S1_{rect}$ is less than the first reference value amplitude; and signal CI2 assumes a value B when $S2_{rect}$ is greater than a second reference value amplitude and assumes a value $\overline{B}$ when $S2_{rect}$ is less than the second reference value amplitude, applying signal CI1 to a second counter and signal CI2 to a third counter such that:
a count of said second counter is decremented by a predetermined amount when signal CI1=A and is incremented by said predetermined amount when CI1=$\overline{A}$; and said third counter is decremented by a second predetermined amount when signal CI2=B and is incremented by said second predetermined amount when signal CI2=$\overline{B}$;

converting a digital value of said count of said second counter to an analog value CA2 and converting a digital value of said count of said third counter to an analog value CA3;

subtracting value CA2 from signal S1 and subtracting CA3 from signal S2;

applying S1 and S2 to devices to obtain signals X1 and X2 respectively wherein:

X1 is binary logic "1" when S1 is a positive half wave, X2 is a binary logic "1" when S2 is a positive half wave, and X1 is binary logic "0" when S1 is a negative half wave and X2 is a binary logic "0" when S2 is a negative half wave, applying X1 to a first counter and X2 to a fourth counter such that:

said first counter's count is decremented by a third predetermined value when an offset is greater than said desired offset and is incremented by a third predetermined value when said offset is less than said desired offset; and said fourth counter's count is decremented by a fourth predetermined value when said offset is greater than said desired offset and is incremented by a fourth predetermined value when said offset is less than said desired offset; and multiplying signal S1 with said first counter's count and multiplying signal S2 with said fourth counter's count.

9. The method of claim 8 wherein:
said offset is greater than said desired offset when either;

signal CI1=A during a rising edge of X2 and signal CI1=$\overline{A}$ during a falling edge of X2 immediately following said rising edge of X2; or signal CI2=B during a rising edge of X1 and signal CI2=$\overline{B}$ during a falling edge of X1 immediately following said rising edge of X1; and said offset is less than said desired offset when either:

signal CI1=$\overline{A}$ during a rising edge of X2 and signal CI1=A during a falling edge of X2 immediately following said rising edge of X2; or signal CI2=$\overline{B}$ during a rising edge of X1 and signal CI2=B during a falling edge of X1 immediately following said rising edge of X1.

* * * * *